United States Patent [19]
Hinson

[11] Patent Number: 5,705,082
[45] Date of Patent: Jan. 6, 1998

[54] ROUGHENING OF METAL SURFACES

[75] Inventor: David Hinson, Stuart, Fla.

[73] Assignee: Chromalloy Gas Turbine Corporation, San Antonio, Tex.

[21] Appl. No.: 378,525

[22] Filed: Jan. 26, 1995

[51] Int. Cl.$^6$ ........................................ C23F 1/00
[52] U.S. Cl. .................. 216/95; 216/100; 216/108; 216/35; 216/34; 427/309
[58] Field of Search ............................ 216/34, 35, 42, 216/49, 100, 108, 109, 95; 427/307, 309

[56] References Cited

U.S. PATENT DOCUMENTS

| | | | |
|---|---|---|---|
| 3,416,975 | 12/1968 | Pollack et al. | 148/6.2 |
| 3,844,859 | 10/1974 | Roni | 216/108 X |
| 4,025,036 | 5/1977 | Melnyk | 228/193 |
| 4,416,725 | 11/1983 | Cuomo et al. | 216/78 |
| 4,551,434 | 11/1985 | Thoma | 436/5 |
| 4,642,161 | 2/1987 | Akahoshi et al. | 216/35 |
| 4,900,398 | 2/1990 | Chen | 156/664 |
| 5,131,977 | 7/1992 | Morizane et al. | 216/22 |
| 5,166,006 | 11/1992 | Lal et al. | 428/612 |
| 5,167,788 | 12/1992 | Hardee et al. | 204/242 |
| 5,217,569 | 6/1993 | Hodgens, II et al. | 156/664 |
| 5,220,725 | 6/1993 | Chan et al. | 216/13 X |
| 5,242,544 | 9/1993 | Itoh et al. | 216/49 |
| 5,258,098 | 11/1993 | Wagner et al. | 156/645 |
| 5,275,693 | 1/1994 | Nakama | 216/42 |
| 5,411,630 | 5/1995 | Nagase et al. | 216/42 X |

*Primary Examiner*—Thi Dang
*Attorney, Agent, or Firm*—Mitchell D. Bittman

[57] ABSTRACT

A process for roughening a metal surface is provided comprising applying a coating to the metal surface wherein the coating is a temporary barrier to an etchant attacking the metal surface and the coating is susceptible to the etchant gradually removing the coating, and then etching the coated metal surface with an aqueous bath containing the etchant effective to produce a roughened metal surface.

17 Claims, 2 Drawing Sheets

ROUGHENING OF METAL SURFACES

BACKGROUND OF THE INVENTION

This invention relates to a method of roughening metal surfaces and the surface produced thereby, more particularly to a process for etching a metal surface.

The aerospace as well as other industries are particularly interested in the etchant treatment of metals preliminary to adhesive bonding since relatively large numbers of components are adhesively bonded to each other to achieve the fabrication of a completed unit. Because of the quantity of bonded components produced the industries are further interested in an economic process which employs readily available and relatively inexpensive etchant materials which may be applied in a variety of ways to meet a variety of needs.

To insure obtaining optimum metal-to-metal or metal-to-nonmetal adhesive bond, the surface of the metal is required to be as clean as possible, but many metals have a surface which is too smooth or uniform to provide an optimum bond subsequent to cleaning. These metals, therefore, are chemically treated to provide an etched surface thereby producing more surface area which contributes to achieving a bond which provides the desired tenacity. However, etching has been limited in the degree of surface roughening which can be achieved. Other roughening techniques have been used including mechanical means such as scratching or burr grinding the surface. These techniques have serious drawbacks including distortion of the substrate, removing excess material (decrease wall thickness), inability or increased difficulty of roughening certain surfaces (e.g. internal surfaces) and inconsistent application, while still being difficult to achieve increased levels of surface roughening desired for certain applications.

SUMMARY

Briefly, this invention provides a process for roughening a metal surface comprising: applying a coating to the metal surface, wherein the coating is a temporary barrier to an etchant attacking the metal surface and the coating is susceptible to the etchant gradually removing the coating; and then etching the coated metal surface with an aqueous bath containing the etchant effective to produce a roughened metal surface.

BRIEF DESCRIPTION OF THE DRAWINGS

In order for the invention to be clearly understood it will be described with reference to the following Figures wherein.

DETAILED DESCRIPTION OF THE INVENTION

Figure 1:
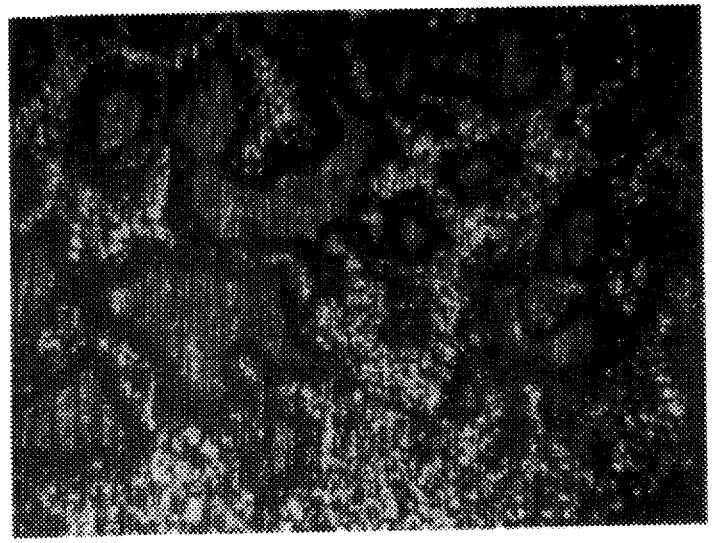
FIG. 1 is a photomicrograph of a titanium surface at a 50× magnification which as been etched in accordance with this invention.

The metals of the substrate are broadly contemplated to be any metal requiring surface roughening for any purpose, including for the subsequent application of coatings, as well as for metal-to-metal or metal-to-nonmetal adhesive bonding. Of particular interest for its ruggedness, corrosion resistance and availability is titanium. As well as the normally available elemental metals themselves, the suitable metals of the substrate can include metal alloys and intermetallic mixtures. For example, titanium may be alloyed with nickel, cobalt, iron, manganese or copper. More specifically, Grade 5 titanium may include up to 6.75 weight % aluminum and 4.5 weight % vanadium, grade 6 up to 6% aluminum and 3% tin, grade 7 up to 0.25 weight % palladium, grade 10, from 10 to 13 weight % molybdenum plus 4.5 to 7.5 weight % zirconium and so on.

Due to their light weight, high strength and thermostability, titanium and its alloys (hereinafter titanium) are useful metals for such aerospace applications as air frames and engine parts. Particularly effective alloys for such applications are the alpha and beta phase Ti—Al alloys as well as the high temperature Ti—Al intermetallics such as $Ti_3Al$ (alpha 2 phase), TiAl (gamma phase) and combinations thereof which are often mixed with the alpha and/or beta alloy phases. Titanium has found particular use as a protective sheath for composites, e.g. as a leading edge for a composite fan blade, wherein the internal surface of the titanium leading edge is roughened prior to adhesive bonding to the composite fan blade.

Regardless of the metal selected the substrate metal advantageously is a cleaned surface. This may be obtained by any of the treatments used to achieve a clean metal surface, but with the provision that unless called for to remove an old coating, mechanical cleaning is typically minimized and preferably avoided. Thus the usual cleaning procedures of degreasing, either chemical or electrolytic, or other chemical cleaning operation may be used to advantage, for example cleaning with an alkaline solution.

The first step of the roughening process involves applying a coating to the metal surface. This coating provides a temporary barrier to the etchant attacking the metal surface with the coating susceptible to being gradually removed by the etchant. The coating initially acts a blocking agent or barrier to the etchant attacking the metal, but slowly and erratically the etchant does penetrate the coating causing a metal surface consisting of high and low areas thus generating the desired roughness. The coating barrier precipitates irregular action between the etchant and the metal preventing uniform removal. The coating does allow gradual etchant attack and acts only as a limited barrier. Various coatings can be used effectively to act as a temporary barrier, with the specific coating chosen dependent upon the type of metal and type and concentration of etchant used in the process, as well as the conditions of etching, including the temperature of the etch bath. A suitable coating would include various polymer compositions, both natural and synthetic. The polymer coating would be subject to partial decomposition by the etchant during the etching step. Specifically the coating can be a curable polymer composition which is applied to the metal surface and then cured to provide an adherent, uniform, cohesive coating which acts as a temporary barrier. Such polymer compositions would generally include a crosslinking agent and/or a catalyst system to provide a coherent coating upon drying and curing. A preferred polymer composition includes heat curable adhesives which act in this matter such as one containing rosin, synthetic polymer and resin which can be applied to the surface by spraying, followed by drying and baking to cure.

The second step of the roughening process involves etching the coated metal surface with a bath containing the etchant which is effective to produce the roughened metal surface. Typical etch solutions are acid solutions. These can be provided by hydrofluoric, hydrochloric, sulfuric, perchloric, nitric, oxalic, tartaric, and phosphoric acids, as well as mixtures thereof. Other etchants that may be utilized include caustic etchants such as a solution of potassium hydroxide/hydrogen peroxide, or a melt of potassium hydroxide with potassium nitrate. While for efficiency of operation, the etch solution is advantageously a strong, or concentrated solution, it should be controlled so that the coating is not removed too rapidly.

When the metal surface is of titanium the preferred etchant is an acid bath containing hydrofluoric acid and preferably also contains an acid selected from hydrochloric acid, nitric acid, phosphoric acid, sulfuric acid, various organic acids and mixtures thereof in aqueous solution. The preferred acid combination for etching the titanium metal surface is a bath comprising hydrofluoric acid and nitric acid. Generally the levels of the components in the bath comprise 1–20% by volume of hydrofluoric acid and 1–20% by volume of nitric acid, preferably 5–10% by volume of hydrofluoric acid and 5–16% by volume of nitric acid. Other ingredients as are commonly used in etching or milling solutions may be used including wetting agents.

The conditions for etching the coated metal surface with the acid bath is important to control the etching of the metal surface. While elevated temperatures are advantageous for etching, in order for the coating to be gradually removed to provide the roughened metal surface the etching conditions must be controlled so the coating is not removed too rapidly. Thus it is preferred that when etching a titanium surface with a hydrofluoric acid/nitric acid etchant bath temperatures within the range of 70°–110° F., preferably 80° to 90° F., are used and generally etching can be carried out for a period time within the range of 1 to 20 minutes, preferably 2 to 10 minutes.

The etching process of this invention is able to achieve controlled, reproducible and desired levels of surface roughness and advantageously is able to achieve high levels of surface roughness, i.e greater than 150 microinches. Generally, the surface of a metal such as titanium is relatively smooth, i.e within a range of 16–63 microinches. By use of the process of this invention a finish of at least 150 microinches and courser can be achieved. Not only is an increased degree of roughness achieved as measured in microinches, but an increased number of average surface peaks per inch can be achieved, generally at a level of at least 150 average surface peaks per inch, preferably at least 200 average surface peaks per inch, which are uniformly distributed over the roughened metal surface. The surface roughness thus achieved is able to provide an enhanced bonding or coating surface. This is achieved without distortion of the metal surface or removal of excess material and can be carried out on surfaces of various geometries including internal surfaces.

In an embodiment of this invention it is desired to etch and provide surface roughness to only portions of the metal surface. Thus prior to etching a mask can be applied to that portion of the metal surface which is not to be roughened by the process of this invention. Suitable masking agents which are resistant to the etchant bath as are suitable and common in the industry may be used such as a plastic tape.

Following the acid bath the metal surface is washed to remove any residual etchant and the residual coating or masking agent is removed by cleaning, e.g. with a solution of an alkaline bath and water washing.

Figure 2:
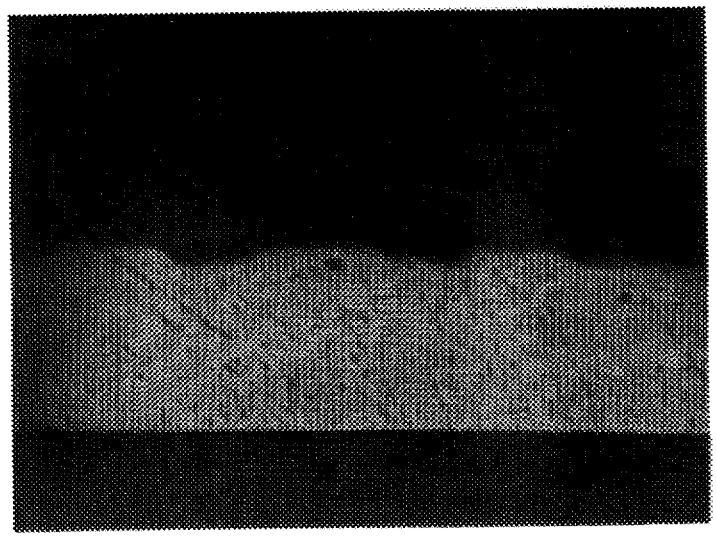
FIG. 2 is a photomicrograph of the side of the etched titanium surface of FIG. 1 at a 50× magnification in which the top surface has been etched in accordance with this invention.
Figure 3:
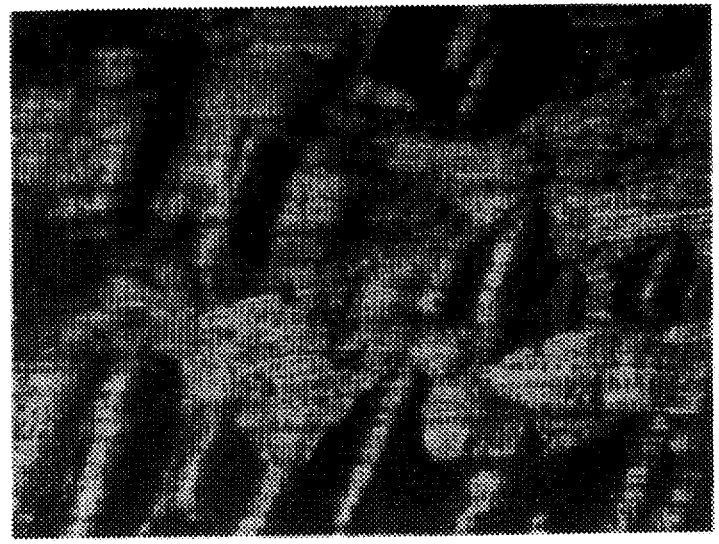
FIG. 3 is a photomicrograph of a titanium surface at a 50× magnification which has been roughened by burr grinding.
Figure 4:
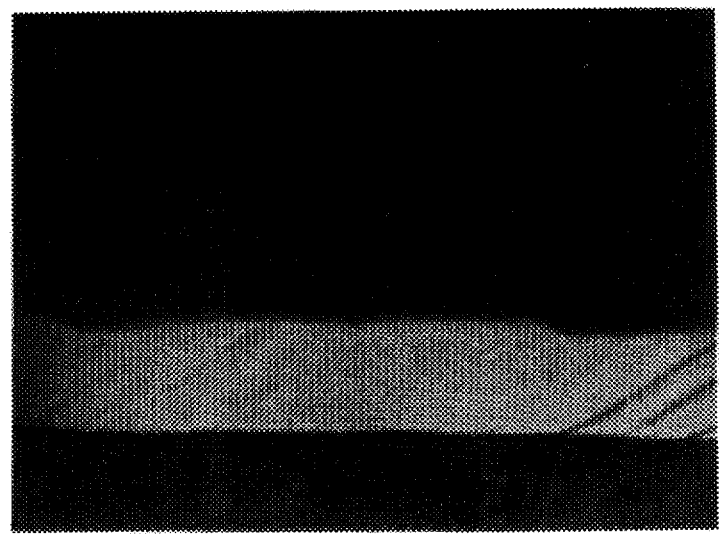
FIG. 4 is a photomicrograph of the side of the titanium surface of FIG. 3 at a 50× magnification in which the top surface has been roughened by burr grinding.

The roughened metal surface obtained by the processes of this invention is found to be unique and differ in its characteristics from prior art surface roughened metals. Prior art etching processes generally provide metal surfaces having a relatively smooth surface (see the bottom surfaces in both FIGS. 2 and 4) wherein there is a uniform reduction of the surface. Prior art manual surface roughening techniques such as burr grinding as shown in FIGS. 3 and 4 provide metal surfaces with inconsistent, non-uniform roughening, e.g. the roughness is not consistently over 150 microinches over the entire surface (e.g. 150 microinches in some areas, but 80 microinches in other areas) and substantially less than 150 average surface peaks per inch are obtained. Further, the surface itself is found to have dents or debits into its surface (see FIG. 3 and 4), not peaks sticking out of its surface (see FIGS. 1 and 2). By the process of this invention a surface roughening is provided in which a consistently rough pattern of peaks and valleys over the entire roughened surface is achieved as shown in FIGS. 1 and 2. A surface roughening of at least 150 microinches and at least 150 average surface peaks per inch are consistently obtained over the entire surface without excessive material reduction, without distortion of the substrate and, without working or stressing the metal surface.

EXAMPLE

A chemical etchant bath was prepared containing the following: 14% by volume of 42° Be nitric acid, 9% by volume hydrofluoric acid (70% grade) and 0.05 ounces per gallon wetting agent.

Titanium sample coupons (AMS 4911 and AMS 4902) were cleaned by grit blasting and then in a solution containing alkaline for 10–30 minutes. The coupons were then rinsed and dried. The surfaces that are not to be roughening have a masking tape (plastic tape) applied to that portion. Then a thin coating of 3M Brand No. 77 Spray Adhesive (containing a mixture of rosin, synthetic polymer and resin in an organic solvent) is applied by spraying onto the coupon metal surface. The coated metal coupon is then baked dry at 180° F. for thirty to forty minutes to cure the coated surface. The coated metal surface is then emersed into the etchant bath for a period of time of 2 to 10 minutes at a temperature of 80°–90° F. After removal from the etchant tank the parts are immediately rinsed and dried and any residual adhesive coating is removed by washing in an alkaline cleaning solution (Turo 4338 by Turo Products Inc.) at 180° F. and a hot water spray, with the masking tape being removed manually. The resultant coupons exhibited areas of roughening in that portion which was not covered by the masking tape. The roughened areas are observed to have a surface roughness of at least 150 microinches and an avenge number of surface peaks per inch in excess of 200 consistently over the entire roughened surface. The surface has the appearance shown in FIGS. 1 and 2 wherein a pattern of peaks and valleys over the entire roughened surface is observed.

What is claimed is:

1. Process for roughening a metal surface comprising:
  applying to the metal surface a coating which is a temporary barrier to an etchant attacking the metal surface, wherein the coating is susceptible to being gradually removed by the etchant and to being erratically penetrated by the etchant causing irregular action between the etchant and the metal; and
  etching the coated metal surface with an aqueous bath containing the etchant effective to produce a roughened metal surface.

2. Process of claim 1 wherein the etchant is an acid.

3. Process of claim 2 wherein the metal surface is of titanium or a titanium alloy.

4. Process of claim 3 wherein the acid bath comprises hydrofluoric acid.

5. Process of claim 4 wherein the acid bath further comprises an acid selected from the group consisting of hydrochloric acid, nitric acid, phosphoric acid, sulfuric acid and mixtures thereof.

6. Process of claim 4 wherein the acid bath further comprises nitric acid.

7. Process of claim 1 wherein the coating is a polymer composition.

8. Process of claim 6 wherein the coating is a polymer composition.

9. Process of claim 8 further comprising drying and curing the polymer composition.

10. Process of claim 9 wherein the polymer composition is a heat curable adhesive.

11. Process of claim 9 wherein etching is continued until the surface roughness is at least 150 microinches.

12. Process of claim 11 wherein etching is continued until the surface roughness is at least 150 average surface peaks per inch.

13. Process of claim 12 further comprising rinsing the roughened metal surface and removing any residual coating from the metal surface.

14. Process of claim 13 further comprising prior to etching applying a mask to that portion of the metal surface which is not to be roughened.

15. Process of claim 6 wherein the acid bath contains 1 to 20% by volume hydrofluoric acid and 1 to 20% by volume of nitric acid.

16. Process of claim 10 wherein the acid bath contains 5 to 10% by volume of hydrofluoric acid and 5 to 16% by volume of nitric acid.

17. Process of claim 16 wherein etching is carded out for 1 to 20 minutes at temperatures in the range of 70°–110° F.

* * * * *